(12) United States Patent
Xiao et al.

(10) Patent No.: US 11,804,062 B2
(45) Date of Patent: Oct. 31, 2023

(54) FINGERPRINT READOUT CIRCUIT AND DISPLAY PANEL THEREOF

(71) Applicant: Wuhan China Star Optoelectronics Technology Co., Ltd., Hubei (CN)

(72) Inventors: Juncheng Xiao, Hubei (CN); Chao Tian, Hubei (CN); Yanqing Guan, Hubei (CN); Yongxiang Zhou, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 558 days.

(21) Appl. No.: 16/975,164

(22) PCT Filed: Jun. 30, 2020

(86) PCT No.: PCT/CN2020/099094
§ 371 (c)(1),
(2) Date: Aug. 24, 2020

(87) PCT Pub. No.: WO2021/253485
PCT Pub. Date: Dec. 23, 2021

(65) Prior Publication Data
US 2023/0100833 A1    Mar. 30, 2023

(30) Foreign Application Priority Data

Jun. 15, 2020 (CN) .......................... 202010540212.4

(51) Int. Cl.
*G06V 40/13* (2022.01)
*G06V 10/147* (2022.01)
*H03F 3/04* (2006.01)

(52) U.S. Cl.
CPC ........ *G06V 40/1318* (2022.01); *G06V 10/147* (2022.01); *G06V 40/13* (2022.01); *H03F 3/04* (2013.01); *G09G 2310/0291* (2013.01)

(58) Field of Classification Search
CPC .. G06V 40/1318; G06V 10/147; G06V 40/13; H03F 3/04; G09G 2310/0291
See application file for complete search history.

(56) References Cited

U.S. PATENT DOCUMENTS

2007/0215970 A1  9/2007 Lee et al.
2013/0009665 A1  1/2013 Clerc et al.
(Continued)

FOREIGN PATENT DOCUMENTS

CN  104200221  12/2014
CN  104662430   5/2015
(Continued)

OTHER PUBLICATIONS

International Search Report and the Written Opinion dated Feb. 26, 2021 From the China National Intellectual Property Administration Re. Application No. PCT/CN2020/099094 and its Translation into English. (17 Pages).
(Continued)

*Primary Examiner* — Premal R Patel

(57) ABSTRACT

A fingerprint readout circuit and a display panel are disclosed. The fingerprint readout circuit includes a voltage amplifier unit, a fingerprint readout unit, and a source follower unit. The voltage amplifier unit is coupled to the fingerprint readout unit and the source follower unit, and the fingerprint readout unit is coupled to the source follower unit. The fingerprint readout circuit has both current and voltage amplification functions. Therefore, a voltage difference is amplified, facilitating reading out fingerprint signals accurately and enhancing fingerprint readout precision and accuracy.

16 Claims, 2 Drawing Sheets

(56) References Cited

U.S. PATENT DOCUMENTS

2016/0275331 A1\* 9/2016 Cheng .................. G01N 27/228
2018/0211080 A1   7/2018 He et al.
2021/0158751 A1\* 5/2021 Cha ...................... G09G 3/2003

FOREIGN PATENT DOCUMENTS

| CN | 104866803 | 8/2015 |
| CN | 106682640 | 5/2017 |
| CN | 110008860 | 7/2019 |
| CN | 110956162 | 4/2020 |
| JP | H11-44587 | 2/1999 |

OTHER PUBLICATIONS

Notification of Office Action and Search Report dated Jan. 20, 2023 From the State Intellectual Property Office of the People's Republic of China Re. Application No. 202010540212.4 and its Translation Into English. (16 Pages).
Han et al. "Mechanism Analysis and Feature Extraction Algorithm of Communication Emitter Fingerprint", International Journal of Electronics and Communications (AEÜ), 106: 89-95, Jul. 2019.
Hou "Circuit System Design of Fingerprint Sensor", Master Thesis, Electronic Journal, 2017 (2): 76P., Feb. 15, 2017. (with English Abstract).

\* cited by examiner

FINGERPRINT READOUT CIRCUIT AND DISPLAY PANEL THEREOF

RELATED APPLICATIONS

This application is a National Phase of PCT Patent Application No. PCT/CN2020/099094 having International filing date of Jun. 30, 2020, which claims the benefit of priority of Chinese Patent Application No. 202010540212.4 filed on Jun. 15, 2020. The contents of the above applications are all incorporated by reference as if fully set forth herein in their entirety.

FIELD AND BACKGROUND OF THE INVENTION

The present disclosure relates to a technical field of displays, and more particularly to a fingerprint readout circuit and a display panel thereof.

With the continuous improvement in living standards, various terminal devices have become necessities in life, and users have higher and higher requirements for terminal devices. In terms of security, fingerprint recognition has an excellent privacy protection function due to unique characteristics of fingerprints. Therefore, fingerprint recognition is widely used in various terminal devices to enhance user experience and security.

At present, fingerprint recognition technology has become one of important functions of electronic products. This function has been paid attention to by many electronic manufacturers and applied in their electronic products.

A fingerprint recognition module integrated in a screen may be implemented in mainly three ways: optical, ultrasonic, and capacitive. An optical fingerprint recognition module mainly uses principles of light refraction and principles of light reflection. A finger is placed on an optical lens. The finger is illuminated by a built-in light source. Light is incident into a prism from the bottom thereof, and emergent from the prism. Angles of emergent light refracted on uneven lines of fingerprint on a finger surface and brightness of light reflected back are different. In this way, fingerprint lines are distinguished. An ultrasonic fingerprint recognition module detects a distance difference between a ridge and a valley according to a time difference between reflected waves, and draws a fingerprint image according to the distance difference. Principles of a capacitive fingerprint recognition module are as follows. A capacitive sensor is integrated into a chip. When a fingerprint is pressed on a surface of the chip, the internal capacitive sensor generates a fingerprint image according to a charge difference caused by a fingerprint ridge and a fingerprint valley.

As illustrated in FIG. 1 which uses a three-transistor (3T) structure, NT3 is configured to amplify current and power. NT3 has a Q node coupled to a fingerprint voltage signal and another terminal coupled to a stable power supply, and therefore has a strong driving strength. NT4 is normally turned on while a fingerprint is read out to control a readout period of the fingerprint. NT5 is a current source thin-film transistor (TFT). NT5 and NT3 together form a source follower that amplifies current and ensures that a voltage signal is as lossless as possible. However, because a signal contrast between fingerprint valleys and fingerprint ridges is small, it is difficult to identify a difference between them. For example, for the optical fingerprint recognition module, when light illuminates fingerprint valleys and ridges, the light is reflected back and arrives at photodiodes which generate different electrical signals. However, because the photodiodes have weaker responses to light intensities, the electrical signals of the photodiodes have smaller differences. After the electrical signals are subjected to larger RC loadings, the signals have some losses and are interfered by noise, causing them extremely difficult to read out accurately.

Therefore, amplifying a voltage difference between a fingerprint valley and a fingerprint ridge becomes an inevitable demand.

SUMMARY OF THE INVENTION

Technical problems are as follows. The related art is disadvantageous for reading out fingerprint signals accurately and has lower fingerprint readout accuracy and precision.

Technical solutions are as follows. The present disclosure discloses a fingerprint readout circuit including a voltage amplifier unit, a fingerprint readout unit, and a source follower unit. The voltage amplifier unit is coupled to the fingerprint readout unit and the source follower unit, and the fingerprint readout unit is coupled to the source follower unit.

The present disclosure also provides a display panel with a fingerprint readout circuit. The display panel includes the fingerprint readout circuit.

Advantageous effects are as follows. In the present disclosure, the fingerprint readout circuit has both current and voltage amplification functions. Therefore, a voltage difference is amplified, facilitating reading out fingerprint signals accurately and enhancing fingerprint readout precision and accuracy.

BRIEF DESCRIPTION OF THE SEVERAL VIEWS OF THE DRAWINGS

In order to describe a technical solution in embodiments more clearly, drawings required to be used by the embodiments are briefly introduced below. Obviously, the drawings in the description below are only some embodiments of the present disclosure. With respect to persons of ordinary skill in the art, under a premise that inventive efforts are not made, other drawings can be obtained based on these drawings.

DESCRIPTION OF SPECIFIC EMBODIMENTS OF THE INVENTION

Technical solutions in the embodiments of the present disclosure will be described clearly and completely hereinafter with reference to the accompanying drawings in the embodiments of the present disclosure. Apparently, the described embodiments are merely some rather than all embodiments of the present disclosure. All other embodiments obtained by those of ordinary skill in the art on the basis of the embodiments of the present disclosure without creative efforts shall fall within the protection scope of the present disclosure.

The terms "first", "second", "third", and "fourth" used in the specification, the claims, and the accompanying drawings of the present disclosure are for distinguishing between different objects rather than describing a particular order. The terms "include", "comprise", and "have" as well as variations thereof are intended to cover a non-exclusive inclusion. For example, a process, method, system, product, or apparatus including a series of steps or units is not limited to the listed steps or units. It can optionally include other steps or units that are not listed, or optionally further include other steps or units inherent to the process, method, product, or device.

The term "embodiment" referred to herein means that a particular feature, structure, or characteristic described in conjunction with the embodiment can be included in at least one embodiment of the present disclosure. The phrase appearing in various places in the specification does not necessarily refer to the same embodiment, nor does it refer to an independent or alternative embodiment that is exclusive of other embodiments. It is expressly and implicitly understood by persons of ordinary skill in the art that an embodiment described herein can be combined with other embodiments.

Figure 1:
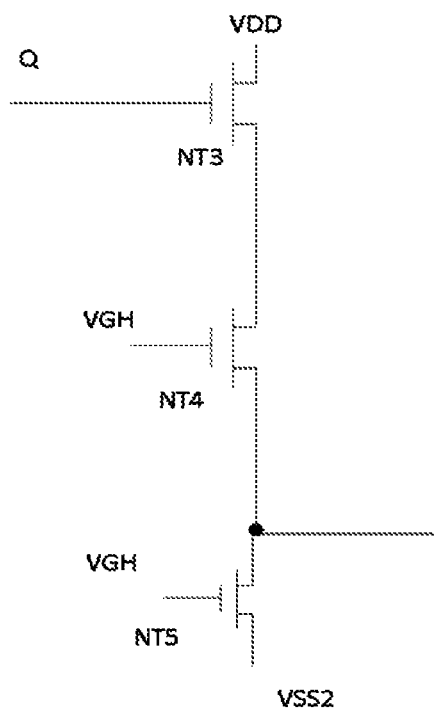
FIG. 1 is a schematic diagram of a fingerprint readout circuit according to the related art.
Figure 2:
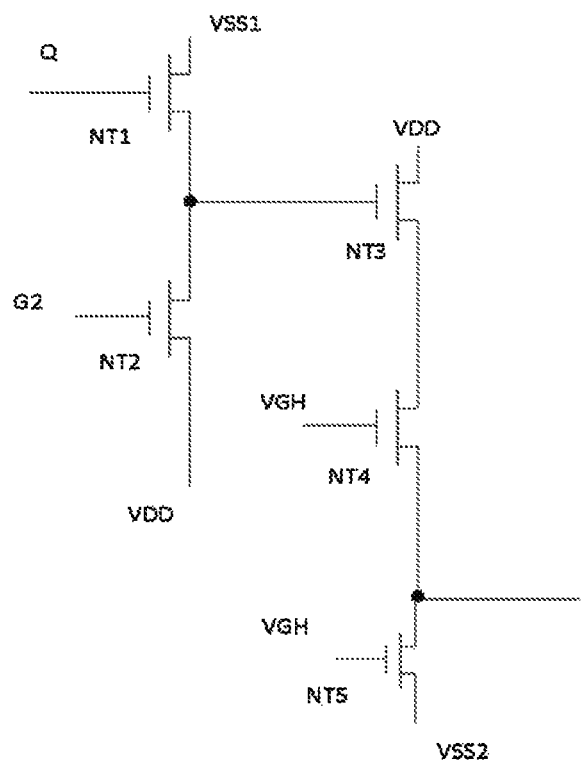
FIG. 2 is a schematic diagram of a fingerprint readout circuit according to an embodiment of the present disclosure.

As illustrated in FIG. 2, the present disclosure discloses a fingerprint readout circuit including a voltage amplifier unit, a fingerprint readout unit, and a source follower unit. The voltage amplifier unit is coupled to the fingerprint readout unit and the source follower unit, and the fingerprint readout unit is coupled to the source follower unit.

In the fingerprint readout circuit of the present disclosure, the voltage amplifier unit includes a first transistor NT1 and a second transistor NT2. The first transistor NT1 has a gate coupled to a fingerprint voltage signal, a source coupled to a first voltage VSS1, and a drain coupled to a source of the second transistor NT2. The second transistor NT2 has a gate coupled to a second voltage, and a drain coupled to a third voltage VDD.

In the fingerprint readout circuit of the present disclosure, the third voltage VDD is larger than the first voltage VSS1.

In the fingerprint readout circuit of the present disclosure, the source follower unit includes a third transistor NT3 and a fifth transistor NT5. The third transistor NT3 has a gate coupled to a node between the drain of the first transistor NT1 and the source of the second transistor NT2, a source coupled to the third voltage VDD, and a drain coupled to the fingerprint readout unit.

In the fingerprint readout circuit of the present disclosure, the fifth transistor NT5 has a source coupled to the fingerprint readout unit, a gate coupled to a fourth voltage VGH, and a drain coupled to a fifth voltage VSS2.

In the fingerprint readout circuit of the present disclosure, the fingerprint readout unit includes a fourth transistor NT4. The fourth transistor NT4 has a gate coupled to the fourth voltage VGH, a source coupled to the drain of the third transistor NT3, and a drain coupled to the source of the fifth transistor NT5.

In the fingerprint readout circuit of the present disclosure, the voltage amplifier unit controls the gain of the voltage amplifier unit by adjusting a power ratio or a voltage ratio.

The present disclosure also provides a display panel with a fingerprint readout circuit. The display panel includes the fingerprint readout circuit.

In the display panel with the fingerprint readout circuit of the present disclosure, a type of the display panel is one of display devices such as a liquid crystal display (LCD) and an organic light-emitting diode (OLED) display (a.k.a. an organic electroluminescence display or an organic light-emitting semiconductor).

To improve sensitivity of fingerprint recognition, timing is adjusted: A duration of the gate of the fourth transistor and a duration while the fourth voltage VGH is at a high level are extended. A corresponding duration while a light-emitting signal line is at a low level and duration during sensor line detection are also extended. Correspondingly, a duration while the light-emitting signal line is at a high level is reduced. A light-emitting duration is decreased, and a fingerprint recognition duration is extended. Accuracy of fingerprint recognition is enhanced, however, at the expense of the corresponding light-emitting duration which causes light-emitting brightness to become darker. Therefore, a time-sharing ratio between fingerprint recognition and display can be determined on the basis of a signal-to-noise ratio after an actual display screen is made.

Concurrently, dynamic adjustment can also be used for driving to realize the following. When fingerprint recognition is needed, a corresponding duration of fingerprint recognition is extended, and when fingerprint recognition is not needed, a display duration is increased to achieve high-brightness display. Concurrently, when low brightness is needed, corresponding current density of OLEDs can be reduced. Therefore, a small driving current is used for ordinary display to achieve longer display life.

Figure 3:
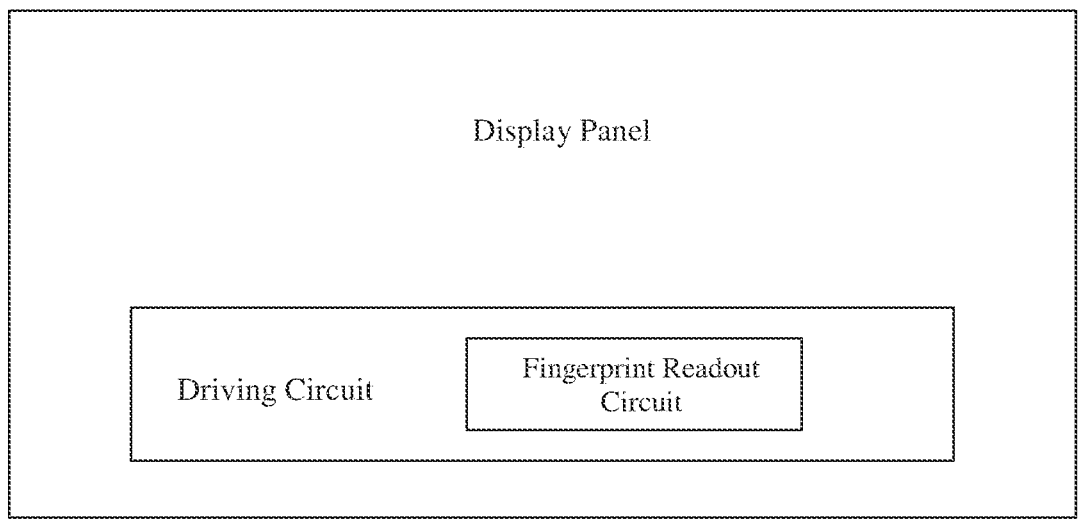
FIG. 3 is a schematic block diagram of a display panel including a driving circuit according to an embodiment of the present application.

In the fingerprint readout circuit of the present disclosure, the display panel includes a driving circuit, and the fingerprint readout circuit is disposed in the driving circuit, as shown in FIG. 3.

In a first specific embodiment, in order for the first transistor NT1 to have a good amplification effect, the first transistor NT1 can operate in a sub-threshold region. In this way, a voltage change at the Q node results in a more obvious current change. That is, a Vgs change in the sub-threshold region causes a more obvious Id change. At the same time, a voltage difference at the gate of the third transistor NT3 is larger, causing a voltage difference finally read out to be larger.

Preferably, the first transistor NT1 and the second transistor NT2 are sized to adjust a gain. When a width-length ratio (W/L) of the first transistor NT1 is larger, the gain is also larger. When W/L of the second transistor NT2 is smaller, the gain is larger. The first transistor NT1 and the second transistor NT2 are sized mainly to control current and equivalent resistance to achieve different voltage division ratios and output voltages.

Compared to the related art, embodiments of the present disclosure have the following advantageous effects.

The present disclosure discloses a fingerprint readout circuit including a voltage amplifier unit, a fingerprint readout unit, and a source follower unit. The voltage amplifier unit is coupled to the fingerprint readout unit and the source follower unit, and the fingerprint readout unit is coupled to the source follower unit. The present disclosure also provides a display panel with a fingerprint readout circuit. The display panel includes the fingerprint readout circuit. Advantageous effects of the present disclosure are as follows. The fingerprint readout circuit has both current and voltage amplification functions. Therefore, a voltage difference is amplified, facilitating reading out fingerprint signals accurately and enhancing fingerprint readout precision and accuracy.

Persons of ordinary skill in the art can understand that steps, measures, and solutions in various operations, methods, and flows having already been discussed in the present disclosure can be altered, modified, combined or deleted. Further, other steps, measures, and solutions included by various operations, methods, and flows having already been discussed in the present disclosure can also be altered, modified, rearranged, discomposed, combined or deleted.

Further, included by the related art, steps, measures, and solutions in various operations, methods, and flows having already been discussed in the present disclosure can also be altered, modified, rearranged, discomposed, combined or deleted.

The terms "first" and "second" are only used for description purpose, and cannot be considered as indicating or implying relative importance or implicitly pointing out the number of relevant technical features. Thus, features being respectively defined as "first" and "second" can each expressly or implicitly include at least one of the features. In the description of the present disclosure, the meaning of "a plurality of" is at least two, such as two and three, unless otherwise definitely and specifically defined. The terms "comprise," "comprising," "include," "including," etc., are intended to specify that elements or objects stated before these terms encompass elements or objects and equivalents thereof listed after these terms, but do not preclude other elements or objects. The phrases "connect", "connected", etc., are not intended to define a physical connection or mechanical connection, but can include an electrical connection, directly or indirectly. "On," "under," "right," "left" and the like are only used to indicate relative position relationship, and when the position of an object which is described is changed, the relative position relationship can be changed accordingly. When an element such as a layer, a film, a region, or a substrate is referred to as being "on" or "under" another element, it can be "directly on" or "directly under" another element, or intervening elements can be present.

It shall be understood that although respective steps in flow diagrams of the figures are shown in sequence as indicated by arrows, these steps are not necessarily executed in sequence according to the order as indicated by the arrows. Unless otherwise definitely described herein, execution of these steps is not limited to a strict order, and these steps can be executed in another order. Furthermore, at least a part of the steps in the flow diagrams of the figures can comprise a plurality of sub-steps or a plurality of phases. These sub-steps or phases are not necessarily executed and completed at the same time, but can be executed at different times. These sub-steps or phases are not necessarily in sequence, but can be executed with other steps or at least a part of sub-steps or phases of other steps by turns or alternately.

The above is only the preferred embodiments of the present disclosure. It is noted that persons of ordinary skill in the art can carry out many changes and modifications without departing from the principles of the present disclosure. These changes and modifications should be included in the protection scope of the present disclosure.

The above is only a portion of embodiments of the present disclosure. It is noted that persons of ordinary skill in the art can carry out many changes and modifications without departing from the principles of the present disclosure. These changes and modifications should be included in the protection scope of the present disclosure. For these changes and modifications, by the description of the above embodiments, persons of ordinary skill in the art can know clearly that various embodiments can be achieved by software plus necessary general hardware platforms. Of course, they can also be achieved by hardware. Based on such understanding, the essence of the technical solutions described above or a part of the technical solutions contributing to the related art can be present in the form of a software product.

Finally, it should be noted that the fingerprint readout circuit and the display panel thereof disclosed in the embodiments of the present disclosure are only the preferred embodiments of the present disclosure, and are only used to illustrate but not to limit the technical solutions of the present disclosure. Although the present disclosure has been described in detail with reference to the foregoing embodiments, persons of ordinary skill in the art should understand that they can still modify the technical solutions described in the foregoing embodiments, or equivalently replace some of the technical features; These modifications or replacements do not divert the essence of corresponding technical solutions from the spirit and scope of the technical solutions of the various embodiments.

What is claimed is:

1. A fingerprint readout circuit, comprising: a voltage amplifier unit, a fingerprint readout unit, and a source follower unit, wherein the voltage amplifier unit is coupled to the fingerprint readout unit and the source follower unit, and the fingerprint readout unit is coupled to the source follower unit;
    wherein the voltage amplifier unit comprises a first transistor and a second transistor; wherein the first transistor has a gate coupled to a fingerprint voltage signal, a source coupled to a first voltage, and a drain coupled to a source of the second transistor; wherein the second transistor has a gate coupled to a second voltage, and a drain coupled to a third voltage; wherein the first transistor and the second transistor are sized to adjust a gain of the voltage amplifier unit; wherein the source follower unit comprises a third transistor and a fifth transistor; wherein the third transistor has a gate coupled to a node between the drain of the first transistor and the source of the second transistor, a source coupled to the third voltage, and a drain coupled to the fingerprint readout unit; wherein the fingerprint readout unit comprises a fourth transistor; wherein the fourth transistor has a gate coupled to a fourth voltage, a source coupled to the drain of the third transistor, and a drain coupled to a source of the fifth transistor.

2. The fingerprint readout circuit of claim 1, wherein the third voltage is larger than the first voltage.

3. The fingerprint readout circuit of claim 1, wherein the fifth transistor has the source coupled to the fingerprint readout unit, a gate coupled to the fourth voltage, and a drain coupled to a fifth voltage.

4. The fingerprint readout circuit of claim 1, wherein the voltage amplifier unit controls the gain of the voltage amplifier unit by adjusting a power ratio or a voltage ratio.

5. A fingerprint readout circuit, comprising: a voltage amplifier unit, a fingerprint readout unit, and a source follower unit, wherein the voltage amplifier unit is coupled to the fingerprint readout unit and the source follower unit, and the fingerprint readout unit is coupled to the source follower unit,
    wherein the voltage amplifier unit comprises a first transistor and a second transistor; wherein the first transistor has a gate coupled to a fingerprint voltage signal, a source coupled to a first voltage, and a drain coupled to a source of the second transistor; wherein the second transistor has a gate coupled to a second voltage, and a drain coupled to a third voltage,
    wherein the source follower unit comprises a third transistor and a fifth transistor; and wherein the third transistor has a gate coupled to a node between the drain of the first transistor and the source of the second transistor, a source coupled to the third voltage, and a drain coupled to the fingerprint readout unit.

6. The fingerprint readout circuit of claim 5, wherein the third voltage is larger than the first voltage.

7. The fingerprint readout circuit of claim 5, wherein the fifth transistor has a source coupled to the fingerprint readout unit, a gate coupled to a fourth voltage, and a drain coupled to a fifth voltage.

8. The fingerprint readout circuit of claim 7, wherein the fingerprint readout unit comprises a fourth transistor; wherein the fourth transistor has a gate coupled to the fourth voltage, a source coupled to the drain of the third transistor, and a drain coupled to the source of the fifth transistor.

9. The fingerprint readout circuit of claim 5, wherein the voltage amplifier unit controls a gain of the voltage amplifier unit by adjusting a power ratio or a voltage ratio.

10. A display panel, comprising: a fingerprint readout circuit comprising a voltage amplifier unit, a fingerprint readout unit, and a source follower unit, wherein the voltage amplifier unit is coupled to the fingerprint readout unit and the source follower unit, and the fingerprint readout unit is coupled to the source follower unit,
wherein the voltage amplifier unit comprises a first transistor and a second transistor; wherein the first transistor has a gate coupled to a fingerprint voltage signal, a source coupled to a first voltage, and a drain coupled to a source of the second transistor; wherein the second transistor has a gate coupled to a second voltage, and a drain coupled to a third voltage,
wherein the source follower unit comprises a third transistor and a fifth transistor; and wherein the third transistor has a gate coupled to a node between the drain of the first transistor and the source of the second transistor, a source coupled to the third voltage and a drain coupled to the fingerprint readout unit.

11. The display panel of claim 10, wherein the third voltage is larger than the first voltage.

12. The display panel of claim 10, wherein the fifth transistor has a source coupled to the fingerprint readout unit, a gate coupled to a fourth voltage, and a drain coupled to a fifth voltage.

13. The display panel of claim 12, wherein the fingerprint readout unit comprises a fourth transistor; wherein the fourth transistor has a gate coupled to the fourth voltage, a source coupled to the drain of the third transistor, and a drain coupled to the source of the fifth transistor.

14. The display panel of claim 10, wherein the voltage amplifier unit controls a gain of the voltage amplifier unit by adjusting a power ratio or a voltage ratio.

15. The display panel of claim 10, wherein a type of the display panel is one of a liquid crystal display (LCD) and an organic light-emitting diode (OLED) display.

16. The display panel of claim 15, wherein the display panel comprises a driving circuit, and the fingerprint readout circuit is disposed in the driving circuit.

* * * * *